United States Patent
Jong et al.

(10) Patent No.: US 7,521,741 B2
(45) Date of Patent: Apr. 21, 2009

(54) SHIELDING STRUCTURES FOR PREVENTING LEAKAGES IN HIGH VOLTAGE MOS DEVICES

(75) Inventors: Yu-Chang Jong, Hsinchu (TW);
Ruey-Hsin Liu, Hsin-Chu (TW);
Yueh-Chiou Lin, Hsinchu (TW);
Shun-Liang Hsu, Hsin-Chu (TW);
Chi-Hsuen Chang, Hsinchu (TW);
Te-Yin Hsia, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/593,424

(22) Filed: Nov. 6, 2006

(65) Prior Publication Data
US 2008/0001189 A1    Jan. 3, 2008

Related U.S. Application Data

(60) Provisional application No. 60/817,676, filed on Jun. 30, 2006.

(51) Int. Cl.
*H01L 29/76* (2006.01)
(52) U.S. Cl. ............... 257/288; 257/315; 257/371; 257/E21.574; 257/E21.642
(58) Field of Classification Search ............ 257/288, 257/371, 499, 315, E21.574, E21.642, E21.648
See application file for complete search history.

(56) References Cited

U.S. PATENT DOCUMENTS

| 5,281,555 | A | | 1/1994 | Cho | |
|---|---|---|---|---|---|
| 5,861,698 | A | | 1/1999 | Murphy | |
| 6,020,616 | A | | 2/2000 | Bothra et al. | |
| 6,201,275 | B1 | * | 3/2001 | Kawasaki et al. | 257/315 |
| 6,281,554 | B1 | * | 8/2001 | Pan | 257/357 |
| 6,979,845 | B2 | * | 12/2005 | Kawaguchi et al. | 257/273 |
| 2006/0065931 | A1 | * | 3/2006 | Lee et al. | 257/355 |
| 2006/0223269 | A1 | * | 10/2006 | Honma | 438/294 |

* cited by examiner

*Primary Examiner*—Sue A Purvis
*Assistant Examiner*—Fazli Erdem
(74) *Attorney, Agent, or Firm*—Slater & Matsil, L.L.P.

(57) ABSTRACT

A high-voltage MOS device includes a first high-voltage well (HVW) region overlying a substrate, a second HVW region overlying the substrate, a third HVW region of an opposite conductivity type as that of the first and the second HVW regions overlying the substrate, wherein the HVPW region has at least a portion between the first HVNW region and the second HVNW region, an insulation region in the first HVNW region, the second HVNW region, and the HVPW region, a gate dielectric over and extending from the first HVNW region to the second HVNW region, a gate electrode on the gate dielectric, and a shielding pattern electrically insulated from the gate electrode over the insulation region. Preferably, the gate electrode and the shielding pattern have a spacing of less than about 0.4 μm. The shielding pattern is preferably connected to a voltage lower than a stress voltage applied on the gate electrode.

20 Claims, 16 Drawing Sheets

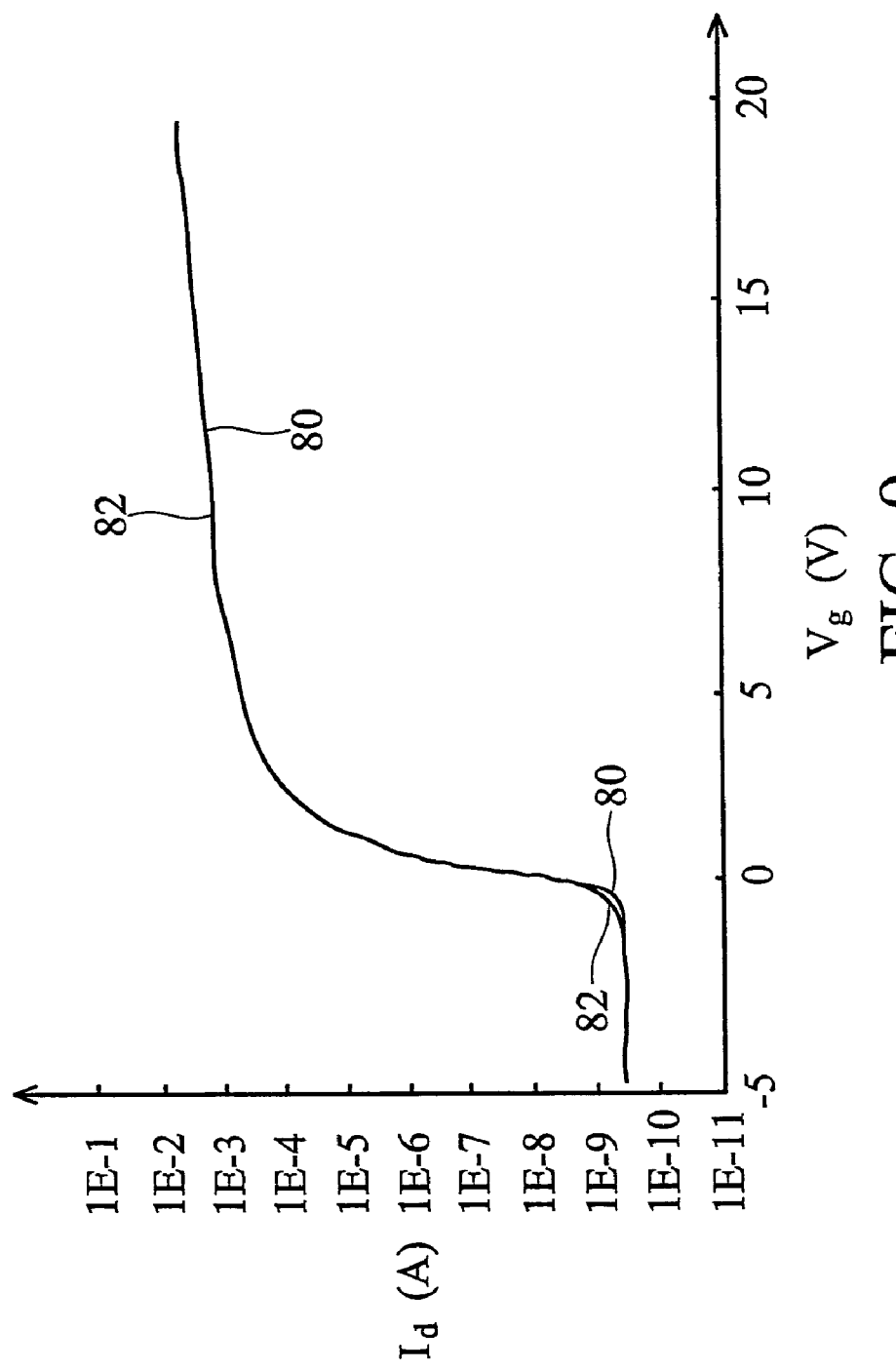

SHIELDING STRUCTURES FOR PREVENTING LEAKAGES IN HIGH VOLTAGE MOS DEVICES

This application claims the benefit of U.S. Provisional Patent Application Ser. No. 60/817,676, filed on Jun. 30, 2006, and entitled "Shielding Structures for Preventing Leakages in High Voltage MOS Devices," which application is incorporated herein by reference.

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as CPU power supplies, power management systems, AC/DC converters, etc.

There are a variety of forms of HVMOS devices. A symmetric HVMOS device may have a symmetric structure on the source side and drain side. High voltage can be applied on both the drain and source sides. An asymmetric HVMOS device may have asymmetric structures on the source side and drain side. For example, only one of the source side and drain side, typically the drain side, is designed for sustaining high voltages.

HVMOS devices may need to undertake a biased-temperature stress (BTS) test, during which a high voltage is applied on the gate to stress the device at an elevated temperature. It has been found that if a symmetric HVNMOS is stress-tested under a high gate-voltage, the leakage current between the drain region and source region significantly increases compared to the leakage current before the BTS stress test. The off-state leakage current can be three to five orders higher than before the BTS stress test. Thereafter, the leakage current stays high even after the BTS stress voltage is removed.

Therefore, a solution for eliminating the effects of the BTS test is needed.

SUMMARY OF THE INVENTION

In accordance with one aspect of the present invention, a high-voltage MOS device includes a first high-voltage well (HVW) region overlying a substrate, a second HVW region overlying the substrate, a third HVW region of an opposite conductivity type as that of the first and the second HVW regions overlying the substrate wherein the HVPW region has at least a portion between the first HVNW region and the second HVNW region, an insulation region in the first HVNW region, the second HVNW region, and the HVPW region, a gate dielectric over and extending from the first HVNW region to the second HVNW region, a gate electrode on the gate dielectric, and a shielding pattern electrically insulated from the gate electrode over the insulation region.

In accordance with another aspect of the present invention, the gate electrode and the shielding pattern have a spacing of less than about 0.4 μm.

In accordance with yet another aspect of the present invention, the shielding pattern is connected to a voltage lower than a stress voltage applied on the gate electrode.

In accordance with yet another aspect of the present invention, a high-voltage MOS device includes a substrate, a first high-voltage N-well (HVNW) region and a second HVNW region in the substrate wherein the first and the second HVNW regions are along a first direction, a high-voltage P-well (HVPW) region in the substrate, the HVPW region having at least a portion between the first HVNW region and the second HVNW region, a gate dielectric over and extending from the first HVNW region to the second HVNW region wherein the gate dielectric has an edge along the first direction, a gate electrode on the gate dielectric, an insulation region in the first HVNW region, the second HVNW region and the HVPW region, wherein the insulation region comprises a portion extending from the edge of the gate dielectric in a second direction perpendicular to the first direction, and a shielding pattern over the insulation region, wherein the shielding pattern is electrically insulated from the gate electrode. Preferably, the gate electrode and the shielding pattern have a spacing of less than about 0.4 μm.

In accordance with yet another aspect of the present invention, a method for forming a high-voltage MOS device includes providing a substrate, forming a first high-voltage well (HVW) region and a second HVW region in the substrate wherein the first and the second HVW regions are of a first conductivity type, forming a third HVW region in the substrate, wherein the third HVW region is of a second conductivity type opposite the first type, and wherein the third HVW region has at least a portion between the first HVW region and the second HVW region, forming an insulation region in the first HVW region, the second HVW region and the third HVW region, forming a gate dielectric over and extending from the first HVW region to the second HVW region, the gate dielectric having an edge adjacent the insulation region, forming a gate electrode on the gate dielectric, and forming a shielding pattern over the insulation region, wherein the shielding pattern is electrically insulated from the gate electrode, and wherein the gate electrode and the shielding pattern have a spacing of less than about 0.4 μm.

The embodiments of the present invention are free from the leakage increase caused by the biased-temperature stress test.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 illustrates leakage currents obtained from a high-voltage MOS device having shielding patterns, wherein no substantial increase in leakage current has been observed.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are described with reference to FIGS. 1A through 1C. The intermediate stages for forming the preferred embodiment of the present invention are then described. Throughout the various views and illustrative embodiments of the present invention, like reference numbers are used to designate like elements. Each figure number may be followed by a letter A, B, or C, indicating that the respective figures are different views of a same structure.

Figure 1A:
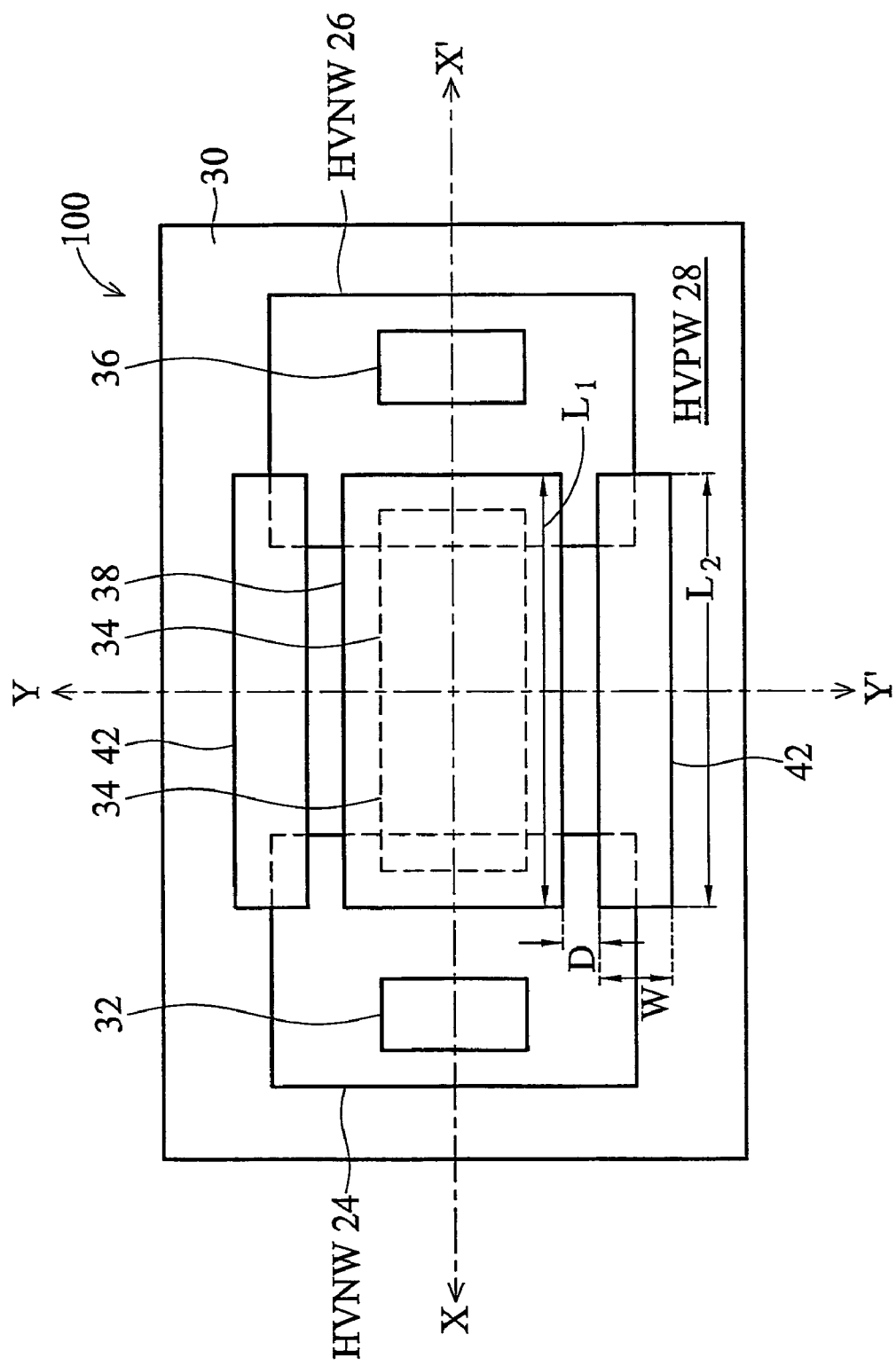
FIGS. 1A through 1C illustrate a preferred embodiment of the present invention.
Figure 1B:
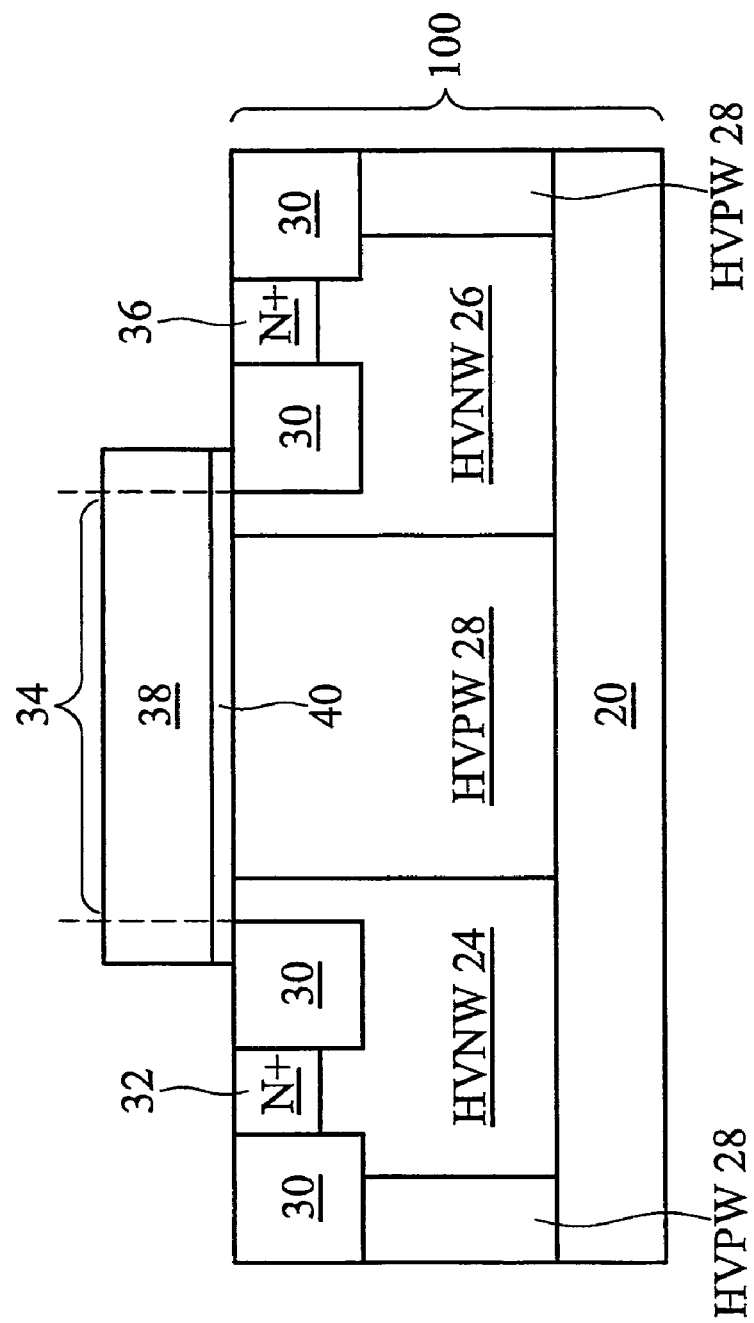
Figure 1C:
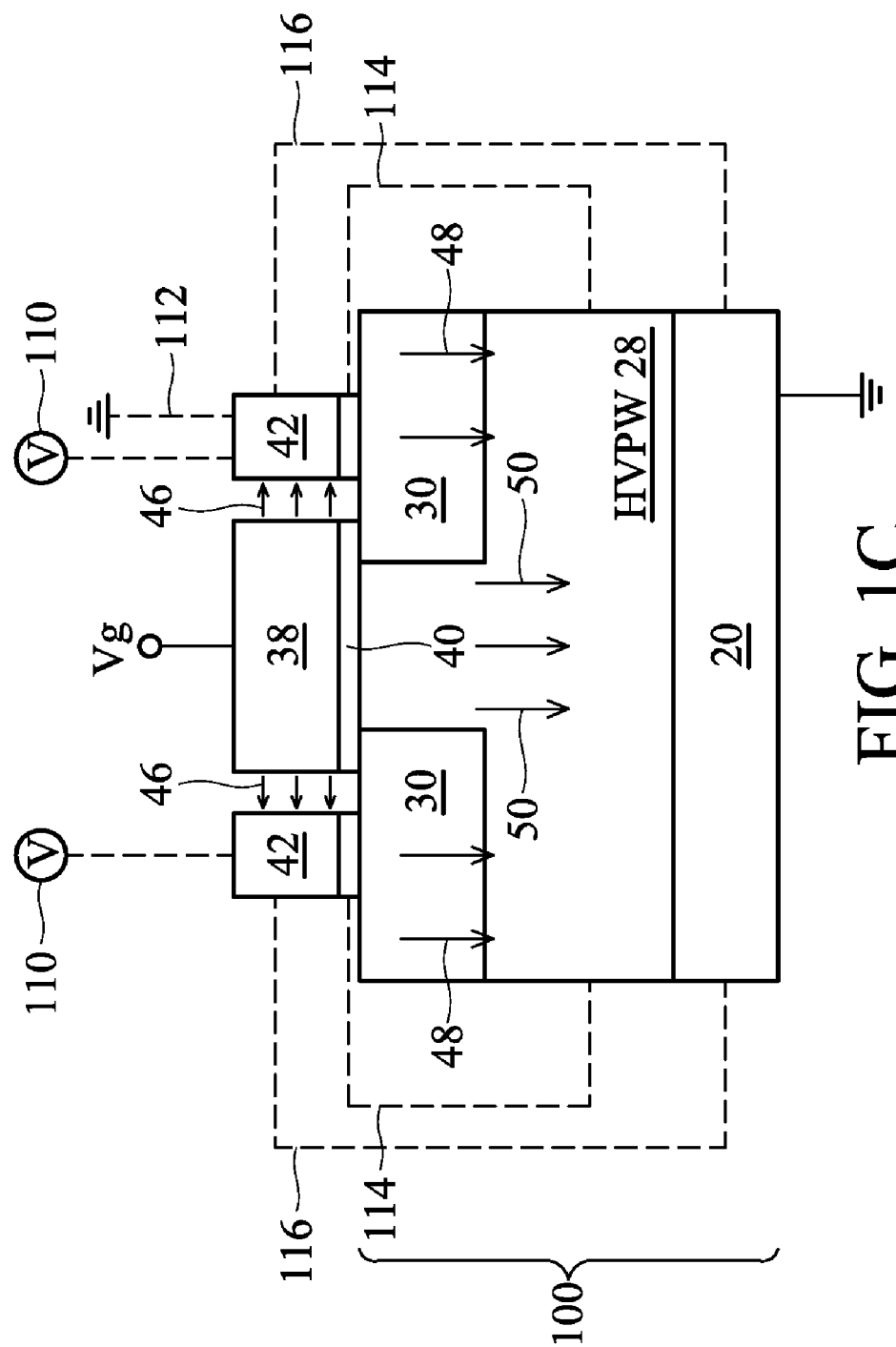

FIGS. 1A, 1B and 1C illustrate a preferred embodiment. FIG. 1A is a top view. A cross-sectional view of FIG. 1A along a line X-X' is shown in FIG. 1B. A cross-sectional view of FIG. 1A along a line Y-Y' is shown in FIG. 1C.

Referring to FIG. 1A, a semiconductor substrate 100 includes two high-voltage N-well (HVNW) regions 24 and 26, and a high-voltage P-well (HVPW) region 28 surrounding HVNW regions 24 and 26. FIG. 1B illustrates that HVNW regions 24 and 26 and HVPW region 28 are formed in a top region of the semiconductor substrate 100 and overlying a base substrate 20. An insulation region 30, which is preferably a shallow trench isolation (STI) region, is formed in HVNW regions 24 and 26 and HVPW region 28. Insulation region 30 preferably covers a significant portion of the illustrated device region, leaving only active regions 32, 34 36 (also refer to FIG. 1A) exposed through the openings in insulation region 30. In the preferred embodiment, insulation region 30 is a single region with all sub regions interconnected, although the cross-sectional views in FIGS. 1B and 1C show that insulation region 30 includes several isolated regions. In other embodiments, insulation region 30 may include a plurality of isolated regions.

Referring to FIG. 1B, on top of the STI region 30 and active region 34, a gate stack including a gate dielectric 40 and a gate electrode 38, is formed. The gate stack preferably covers active region 34 and extends onto the surrounding portions of insulation region 30. Active regions 32 and 36 are doped to form source/drain regions, which are also denoted as regions 32 and 36, respectively. As source/drain regions 32 and 36 are spaced apart from the respective sides of the gate electrode 38, the resulting MOS device can sustain high voltages.

Referring back to FIG. 1A, two shielding patterns 42 are formed over insulation region 30 and in close proximity to gate electrode 38. Shielding patterns 42 may be formed using commonly used conductive materials such as polysilicon, metals, metal silicides, metal nitrides, and the like. The width W of shielding patterns 42 may be of any value allowed by design rules, and is preferably less than about 8 μm, and even more preferably equals the minimum length allowed by design rules. For example, in a 0.18 μm process, width W is about 0.25 μm. In a 65 nm process, width W is about 0.12 μm. In even smaller scales, width W is even less than about 0.12 μm. Shielding patterns 42 and gate electrode 38 preferably have a small spacing D, providing they are electrically insulated. Details regarding the preferred values of length $L_2$ and spacing D of shielding patterns 42 will be discussed in subsequent paragraphs.

Shielding patterns 42 are preferably connected to the underlying HVPW regions 28 (refer to FIG. 1B), for example, through contacts and metal lines (not shown). Alternatively, shielding patterns 42 are connected to another feature (symbolized by voltage source 110) that will have a lower voltage than a stress voltage $V_g$ when a biased-temperature stress (BTS) test is performed and stress voltage $V_g$ is applied on gate electrode 38. In this case, the voltage difference between shielding patterns 42 and the underlying HVPW regions 28 (and/or base substrate 20) is preferably less than about 50 percent, and more preferably less than about 25 percent, of the stress voltage $V_g$. Even more preferably, shielding patterns 42 are grounded, as shown by dotted line 112, if the HVPW regions 28 (and base substrate 20) are grounded. In an exemplary embodiment, if a 40V BTS stress voltage $V_g$ is applied, the voltage potential on shielding patterns 42 is preferably less than about 20V, and more preferably less than about 10V, and even more preferably 0V. The exemplary connection to shielding patterns 42 includes, but is not limited to, directly connecting the shielding patterns 42 and the underlying HVPW regions 28 (and/or base substrate 20) through conductive lines, or connecting them through resistors (not shown). The connections are illustrated using dotted lines 114 and 116.

FIG. 1C illustrates a cross-sectional view of the embodiment in FIG. 1A along a line Y-Y'. When the preferred embodiment is stressed, for example, by applying a high voltage $V_g$ on gate electrode 38 and grounding HVNW regions 24 and 26 (and/or base substrate 20), electrical fields are generated between features having different voltage potentials. Arrows 46, 48, and 50 symbolize the exemplary electrical fields. If shielding patterns 42 have a same voltage potential as the underlying HVPW regions 28, the electrical field 48 is reduced to zero.

Figure 2A:
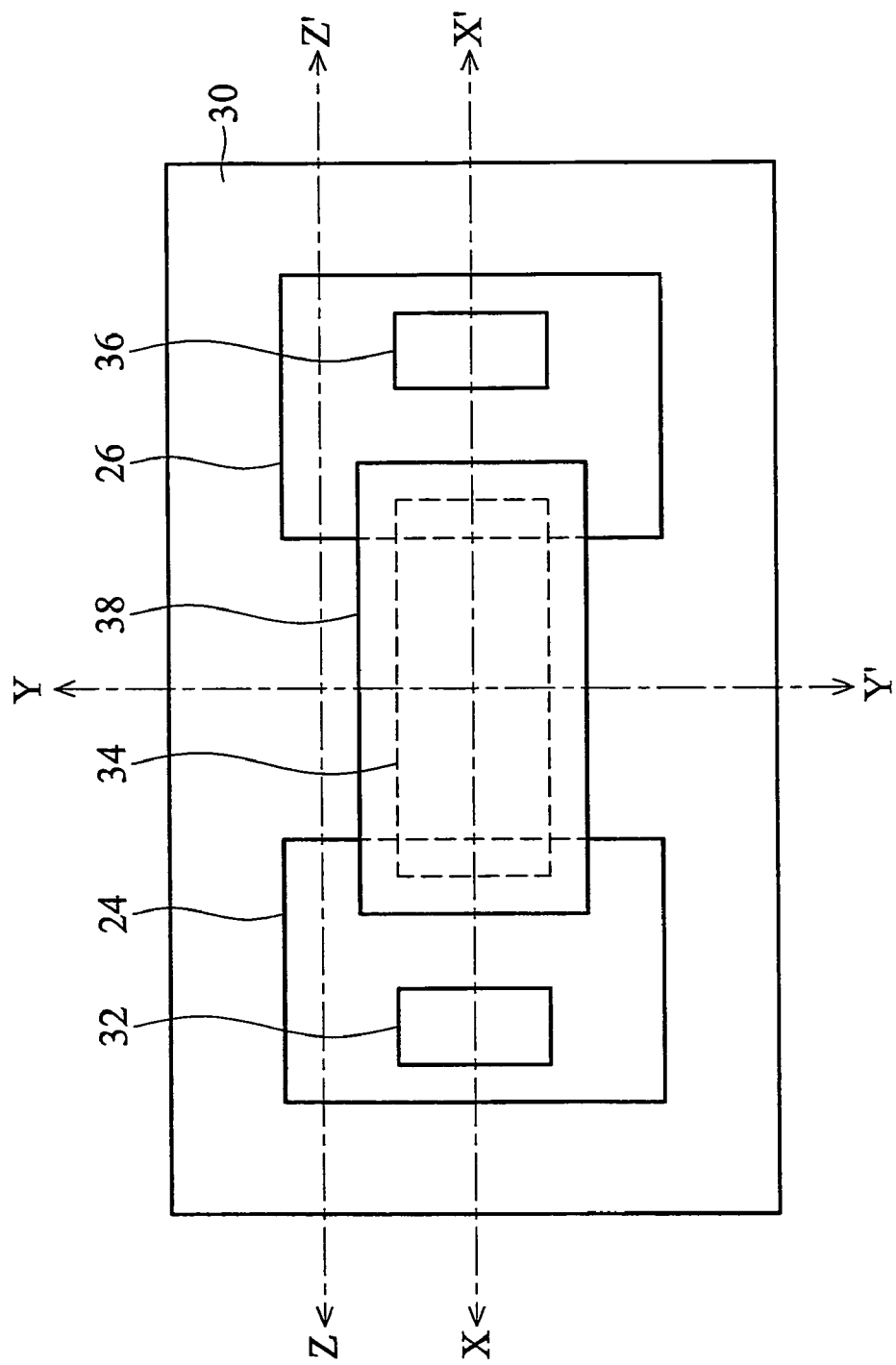
FIGS. 2A through 2C are a top view and cross-sectional views of a high-voltage MOS device having no shielding patterns.
Figure 2B:
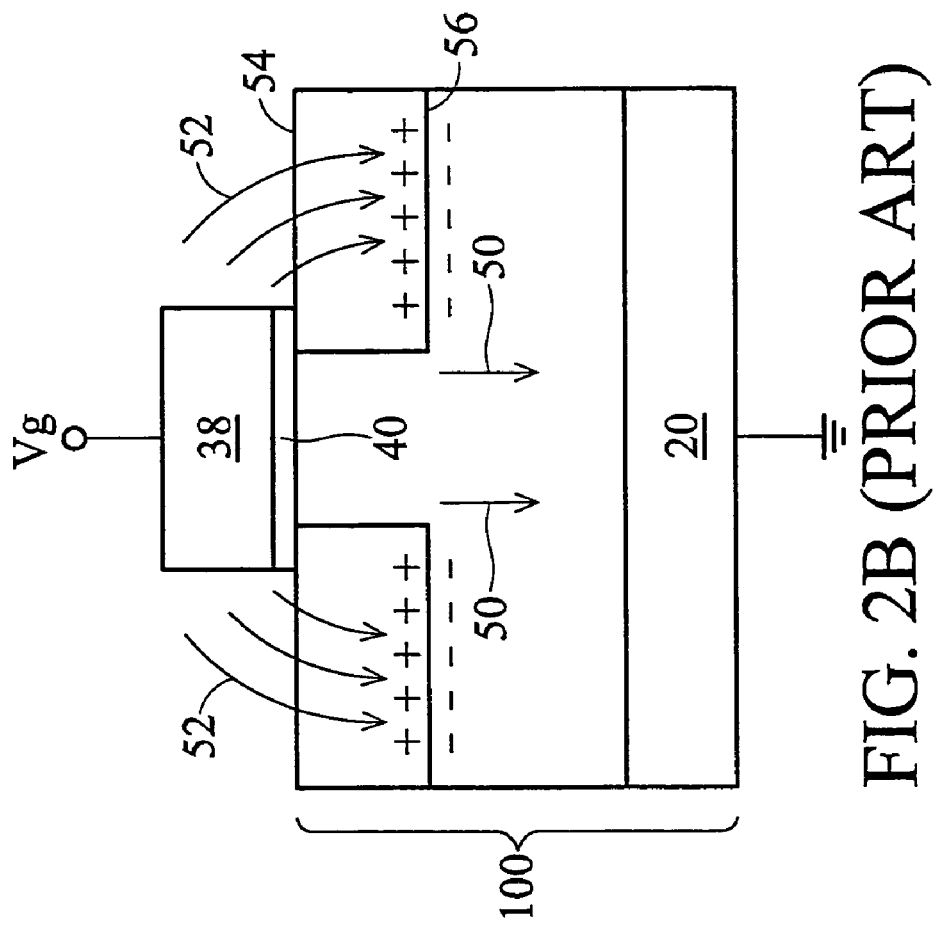

Assuming that shielding patterns 42 are removed from the preferred embodiment, and a same voltage stress voltage $V_g$ is applied to gate electrode 38, the electrical field distribution changes accordingly, as is illustrated in FIG. 2B. The respective top view is shown in FIG. 2A. When a high voltage $V_g$ is applied between the gate electrode 38 and base substrate 20, a high electrical field 52 is generated in STI 30. As a result, negative charges such as electrons are attracted to a top surface 54 of insulation region 30, while positive charges such as holes are repelled and/or left close to a bottom surface 56 of insulation region 30. Since insulation region 30 comprises dielectric materials, even after the stress, such a charge distribution remains.

Figure 2C:
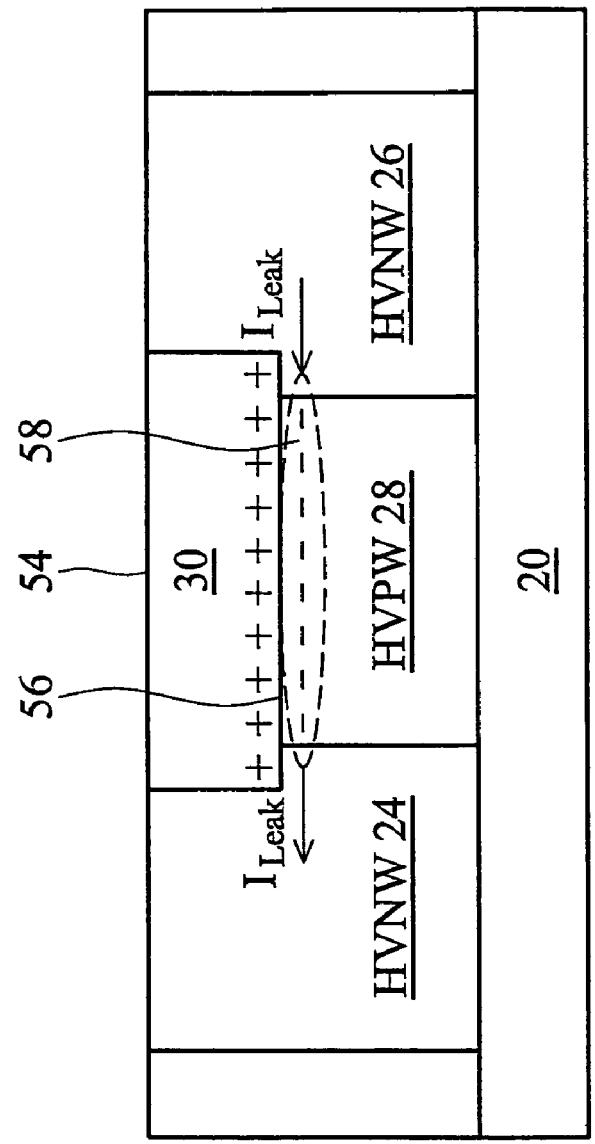

FIG. 2C illustrates a cross-sectional view of the embodiment in FIG. 2A along a line Z-Z', also assuming the shielding patterns 42 (refer to FIG. 1A) are removed. It is noted that due to the positive charges at the bottom surface 56 of insulation region 30, negative charges in HVPW 28 are attracted to a region close to the bottom surface 56 of insulation region 30, and thus an inversion region 58 is formed. The inversion region 58 forms a conductive path connecting HVNW region 24 and HVNW region 26. Therefore, a leakage current $I_{Leak}$ exists even though the high voltage MOS device is at an off state.

Based on the findings and analysis provided in the preceding paragraphs, shielding patterns 42 are advantageously added to the preferred embodiments, as have already been shown in FIGS. 1A and 1C. Referring to FIG. 1C again, since shielding patterns 42 are grounded or connected to a low voltage potential, high electrical fields are effectively shielded within a region between gate electrode 38 and shielding patterns 42. Electrical fields 48 in insulation region 30 are at least significantly reduced (if shielding patterns are at a voltage between ground potential and stress voltage $V_g$), or substantially eliminated if shielding patterns 42 are grounded. As can be found from the previous discussions, the voltage applied on shielding patterns 42 will at least cause the electrical field 48 (refer to FIG. 1C) to be low enough, so that substantially no charge moves because of the electrical field 48.

Figure 3A:
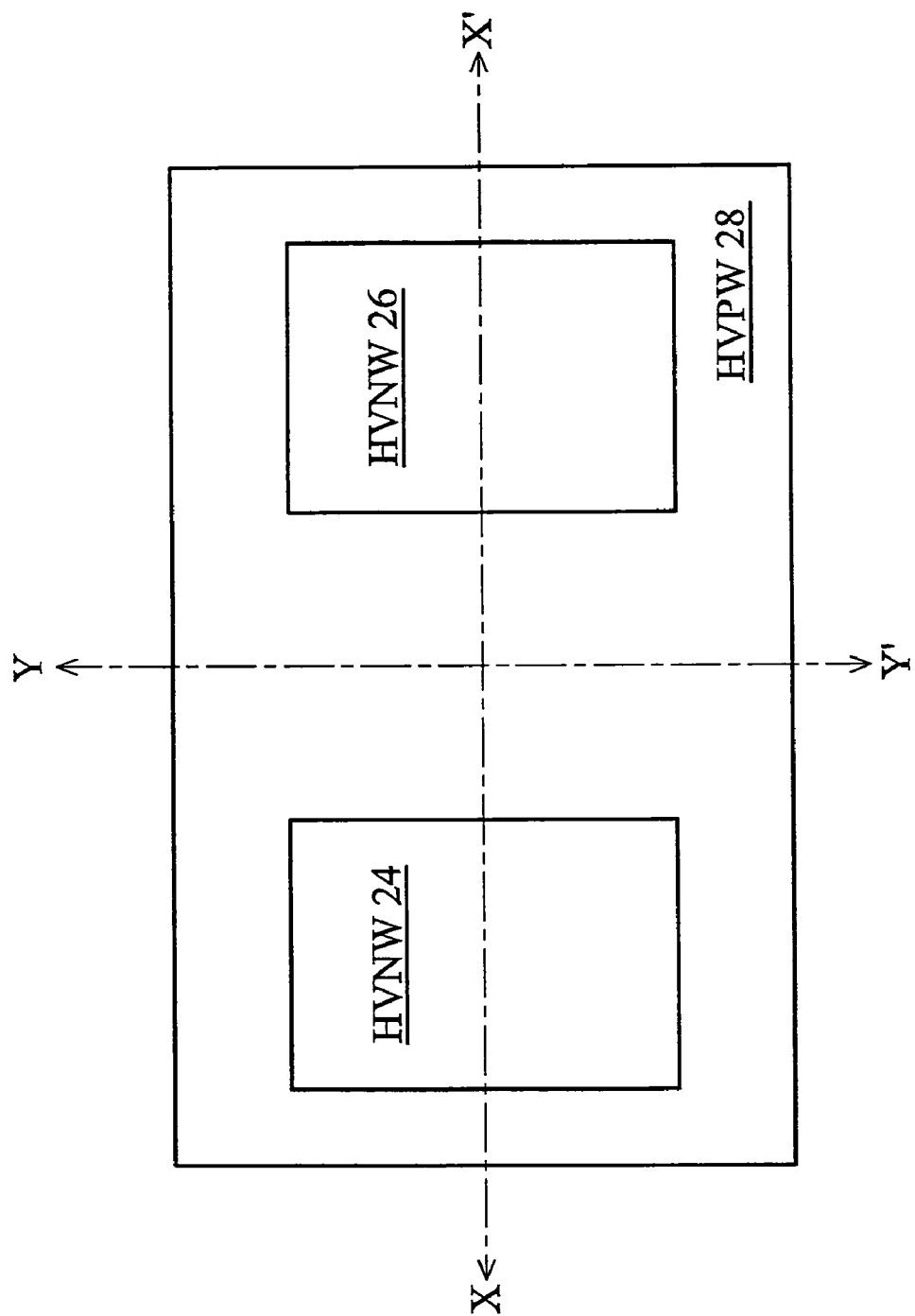
FIGS. 3A through 4C are top views and cross-sectional views of intermediate stages in the manufacture of a preferred embodiment shown in FIGS. 1A through 1C.

FIGS. 3A through 4C illustrate an exemplary formation process for forming the preferred embodiment. FIG. 3A is a top view of a semiconductor substrate including HVPW region 28 and HVNW regions 24 and 26. HVPW region 28 is lightly doped with p-type impurities, such as boron and/or indium, and HVNW regions 24 and 26 are lightly doped with n-type impurities, such as antimony and/or arsenic. The preferred impurity concentrations are between about $10^{15}/cm^3$ and about $10^{18}/cm^3$, although higher or lower concentrations may be used.

Figure 3B:
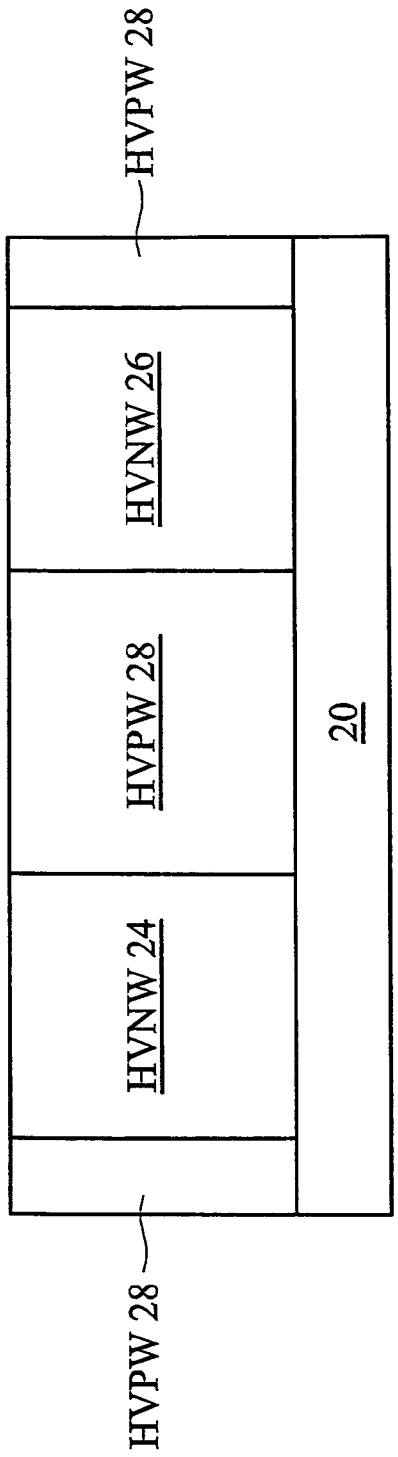

A cross-sectional view of FIG. 3A along a line X-X' is shown in FIG. 3B. HVPW region 28 and HVNW regions 24 and 26 are formed over base substrate 20, which preferably comprises a semiconductor material such as silicon, although other semiconductor materials may be used. Substrate 20 is preferably of p-type. Alternatively, the substrate may be doped with n-type impurities.

Figure 3C:
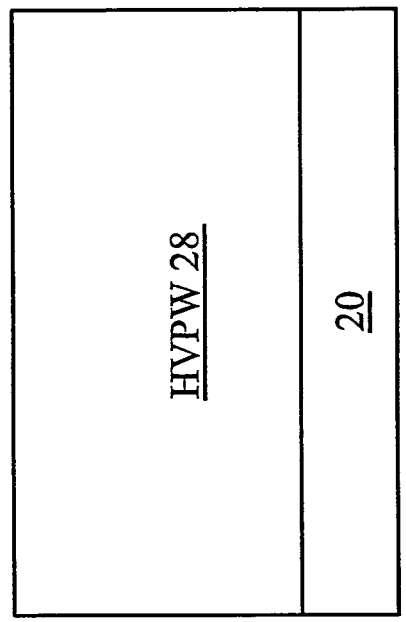

Optionally, an N+ buried layer (NBL) (not shown), preferably having a conductivity type opposite the conductivity type of substrate 20, is formed in a top region of base substrate 20. The NBL preferably has a dopant concentration of about $10^{16}/cm^3$ to about $10^{18}/cm^3$. It acts as an electrical isolation region isolating the HVNW and HVPW regions subsequently formed over the NBL from substrate 20. If the NBL is formed, HVPW region 28 and HVNW regions 24 and 26 are preferably formed by epitaxially growing a semiconductor layer over the NBL and implanting appropriate impurities. Otherwise, HVPW region 28 and HVNW regions 24 and 26 may be formed by simply implanting a top region of base substrate 20. A cross-sectional view of FIG. 3A along a line Y-Y' is illustrated in FIG. 3C, wherein only HVPW region 28 is shown in the view.

Figure 4A:
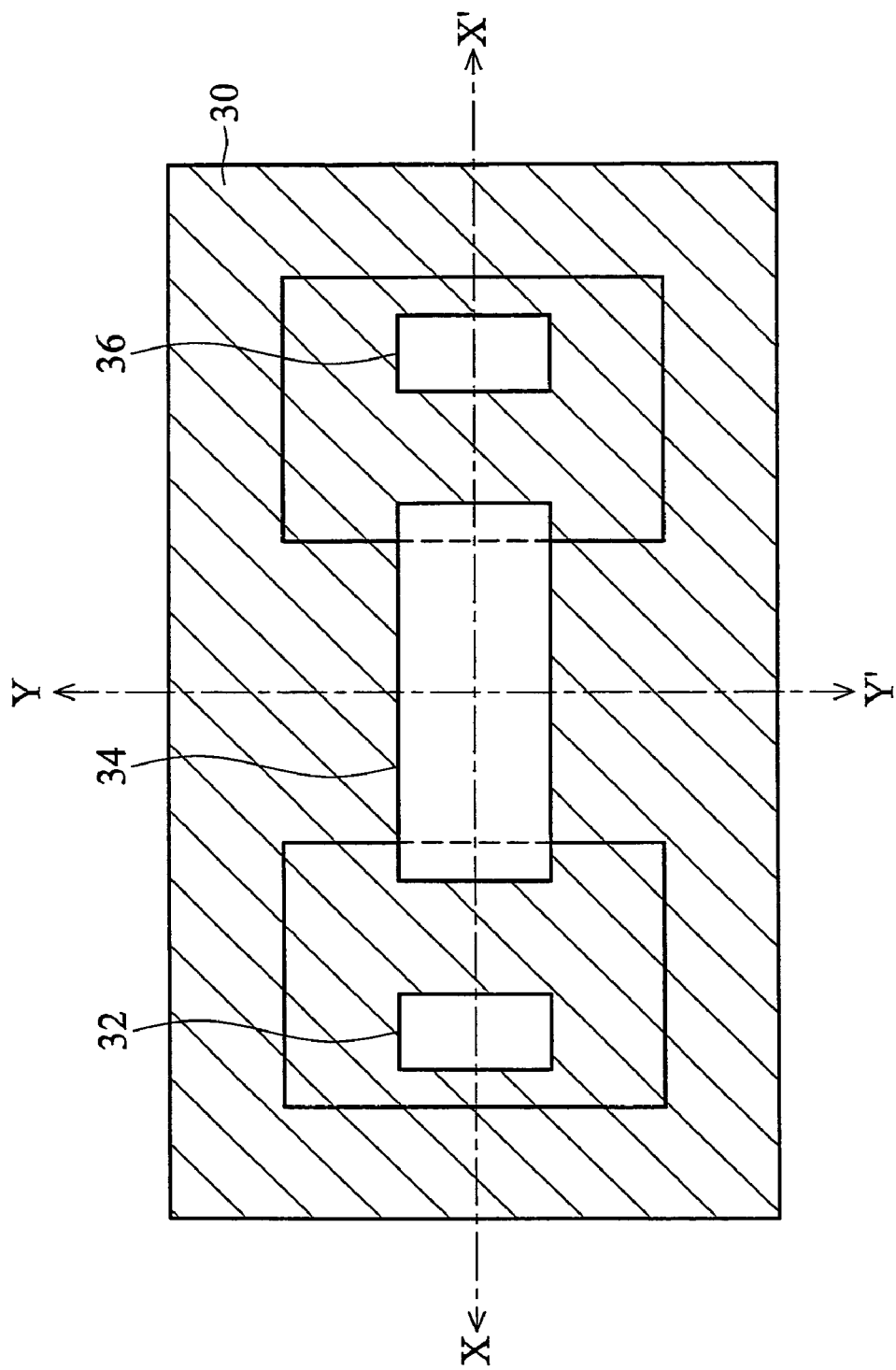
Figure 4B:
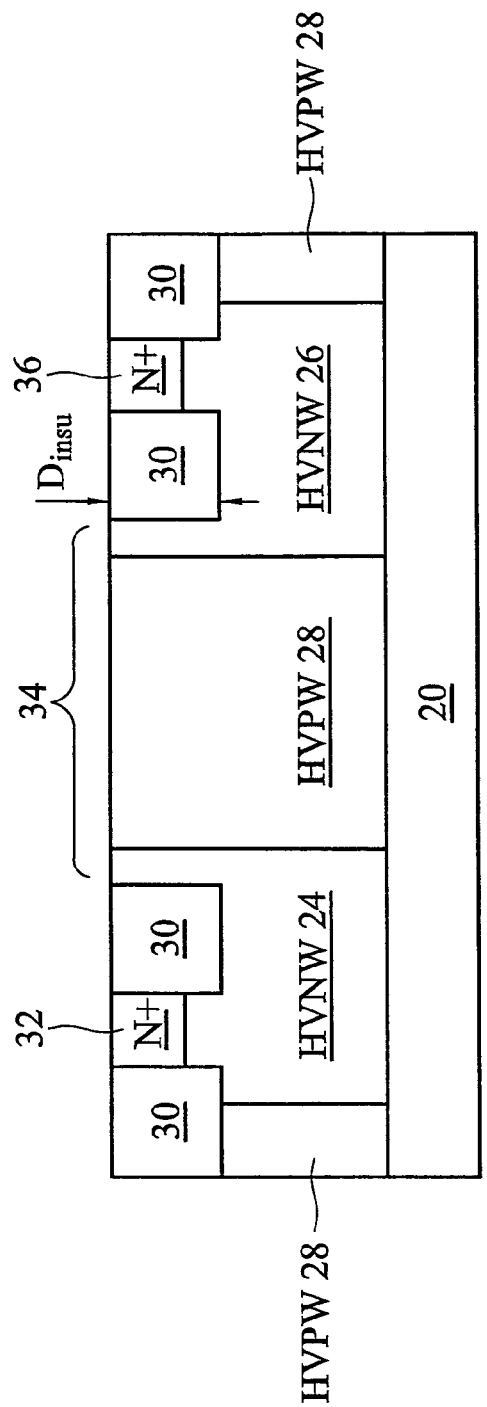
Figure 4C:
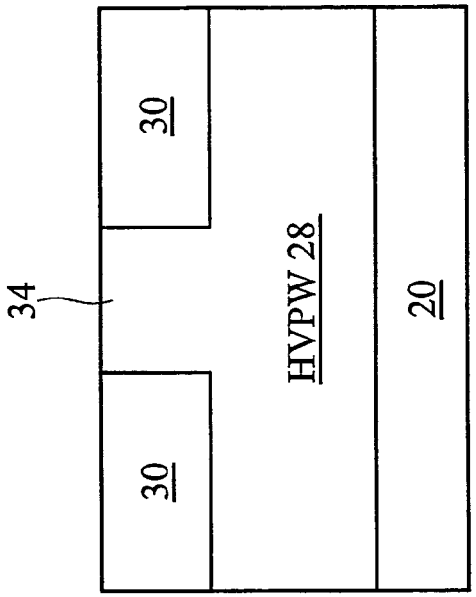

Referring to FIGS. 4A, 4B and 4C, insulation region 30 is formed. FIG. 4A is a top view of the resulting structure. Insulation region 30 (shaded in FIG. 4A for a clearer view) covers the entire illustrated region except active regions 32, 34 and 36. In a cross-sectional view along a line X-X', insulation region 30 is shown as being formed in HVPW region 28 and HVNW regions 24 and 26. Insulation region 30 preferably has a depth $D_{insu}$ of less than about 0.5 µm. FIG. 4C illustrates a cross-sectional view along a line Y-Y' as shown in FIG. 4A.

In the preferred embodiment, insulation region 30 is a shallow trench isolation (STI) region. As is known in the art, STI region 30 may be formed by forming a shallow trench in the substrate, filling the trench with a dielectric material, for example, high-density plasma (HDP) oxide, and performing a chemical mechanical polish to level the surface. In other embodiments, insulation region 30 is a field oxide region. Preferably, field oxide region 30 is formed by forming a mask layer such as a silicon nitride, forming an opening in the mask layer, and performing a local oxidation of silicon (LOCOS). The mask layer is then removed.

A gate stack, including gate electrode 38, the underlying gate dielectric 40, and shielding patterns 42, is then formed, and the resulting structure has already been shown in FIGS. 1A, 1B and 1C. The gate stack preferably covers active region 34, and more preferably extends onto insulation region 30 (refer to FIG. 4A). The exposed active regions 32 and 36 are then doped with n-type impurities, preferably to a concentration of about $10^{18}/cm^3$ or even higher, forming source/drain regions that are also denoted as 32 and 36.

In the preferred embodiment, shielding patterns 42 are formed simultaneously with the gate electrode 38, and thus they are formed of same materials. Accordingly, shielding patterns 42 are likely to have underlying dielectric layers that are simultaneously formed with gate dielectric 40 if the underlying dielectric layers are deposited. However, if gate dielectric 40 comprises thermal oxide, shielding patterns 42 will not have the underlying dielectric layers. Alternatively, shielding patterns 42 may be formed separately from the gate electrode 38, and thus the materials of shielding patterns 42 and 38 may be different, and shielding patterns 42 may be formed directly on insulation region 30.

It should be noted that shielding patterns 42 are different from the well-known dummy patterns, which may also be simultaneously formed with gate electrode 38 for the reduction of pattern-loading effects. Dummy patterns are preferably formed away from gate electrode 38. Otherwise, the purpose of improving the evenness of pattern densities will be defeated. For example, in a 0.25 µm process, design rules require that the spacing between gate electrode 38 and a neighboring dummy pattern be greater than about 0.5 µm. Shielding patterns, however, are preferably close to the gate electrode. Additionally, dummy patterns are floating. Shielding patterns 42, however, need to be connected to other features, preferably substrate 20, in order to have shielding effects.

Figure 5A:
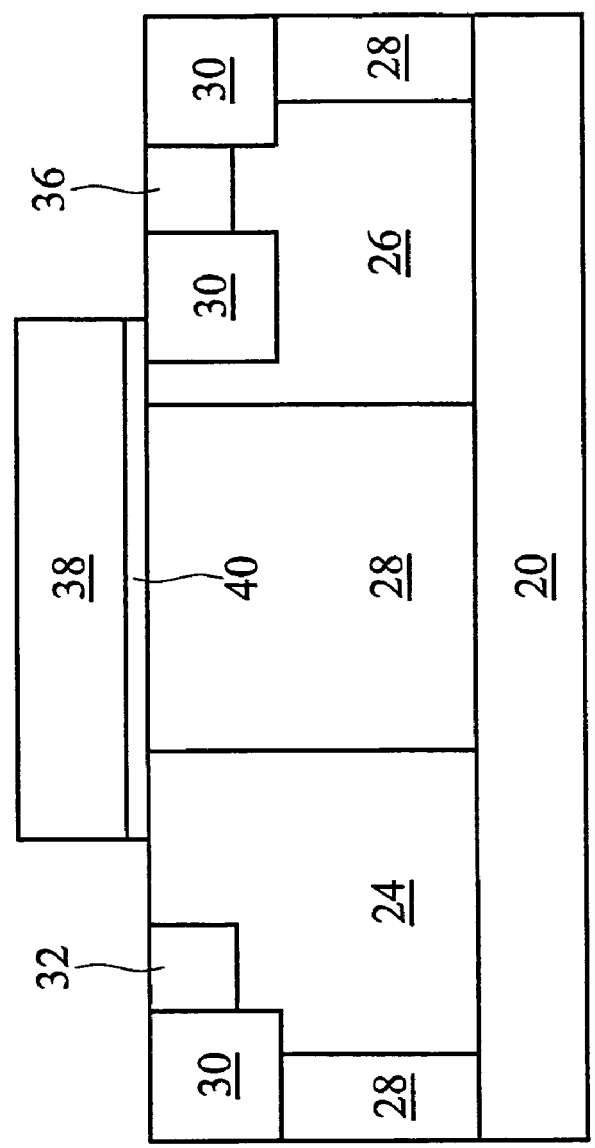
FIGS. 5A and 5B illustrate variations of the preferred embodiment.
Figure 5B:
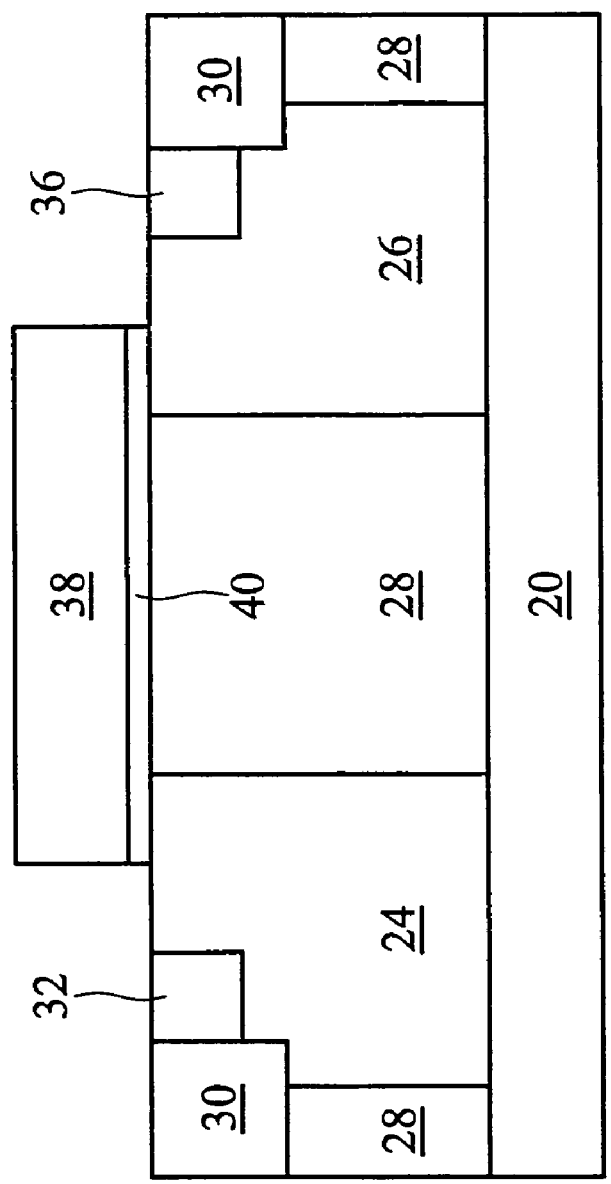

The preferred embodiment may have a plurality of variations. For example, FIG. 5A illustrates a HVNMOS with insulation region 30 formed only between one of the source/drain regions 32/36 and the channel region of the HVNMOS device. Alternatively, no insulation region may be formed between any of the source/drain regions 32/36 and the channel region, as is shown in FIG. 5B.

Figure 6:
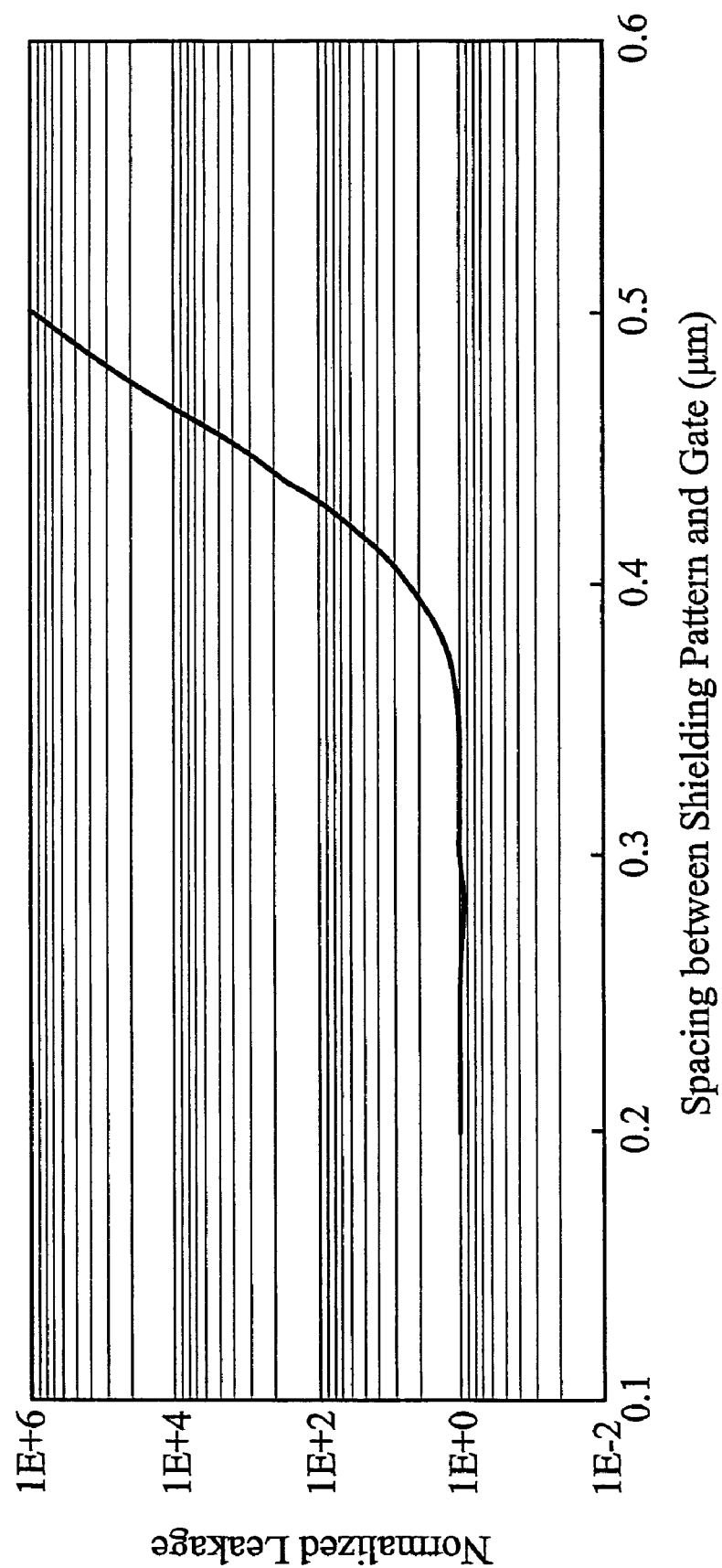
FIG. 6 illustrates normalized leakage as a function of a spacing between a shielding pattern and a gate.

FIG. 6 schematically illustrates the relationship between normalized BTS leakage current and spacing D between shielding patterns 42 and gate electrode 38. It is found that spacing D (refer to FIG. 1A) between gate electrode 38 and shielding patterns 42 is preferably less than about 0.4 µm, and more preferably less than about 0.3 µm, and even more preferably less than about 0.25 µm. Spacing D is also preferably as small as allowed by the design rule specified by the integrated circuit formation technique. For example, in a 0.18 µm process, the minimum spacing D is about 0.25 µm. In a 65 nm process, the minimum spacing D is about 0.12 µm. In even smaller scales, the minimum spacing D is even less than about 0.12 µm.

Figure 7:
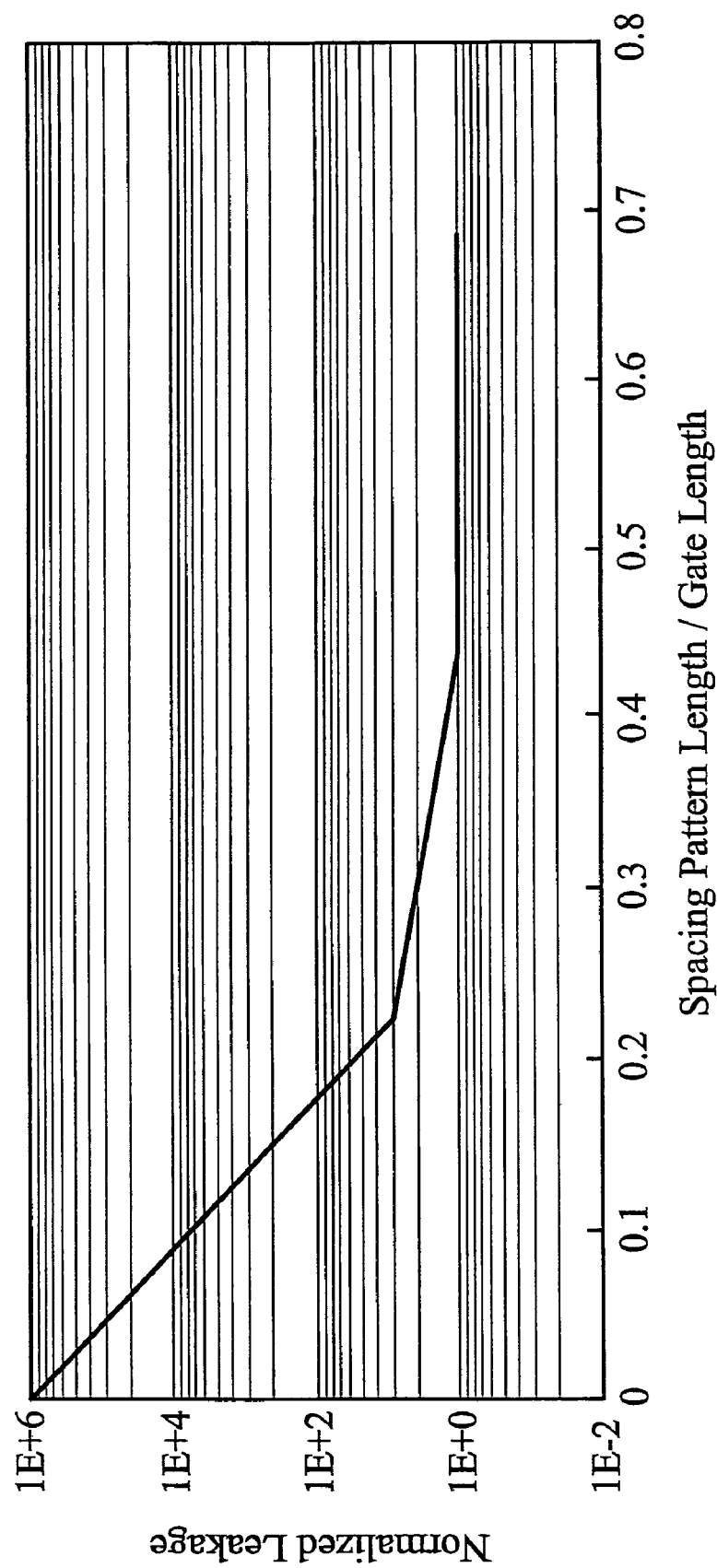
FIG. 7 illustrates normalized leakage as a function of a ratio of a shielding pattern length to a gate length.

FIG. 7 schematically illustrates the relationship between a normalized BTS leakage current and a ratio of the length $L_2$ of shielding patterns 42 to a gate length $L_1$ of gate electrode 38 (refer to FIG. 1A). It is found that in order to effectively reduce the leakage current, length $L_2$ is preferably greater than about 20 percent of length $L_1$, and more preferably greater than about 40 percent of length $L_1$, and even more preferably equal to length $L_1$.

Figure 8:
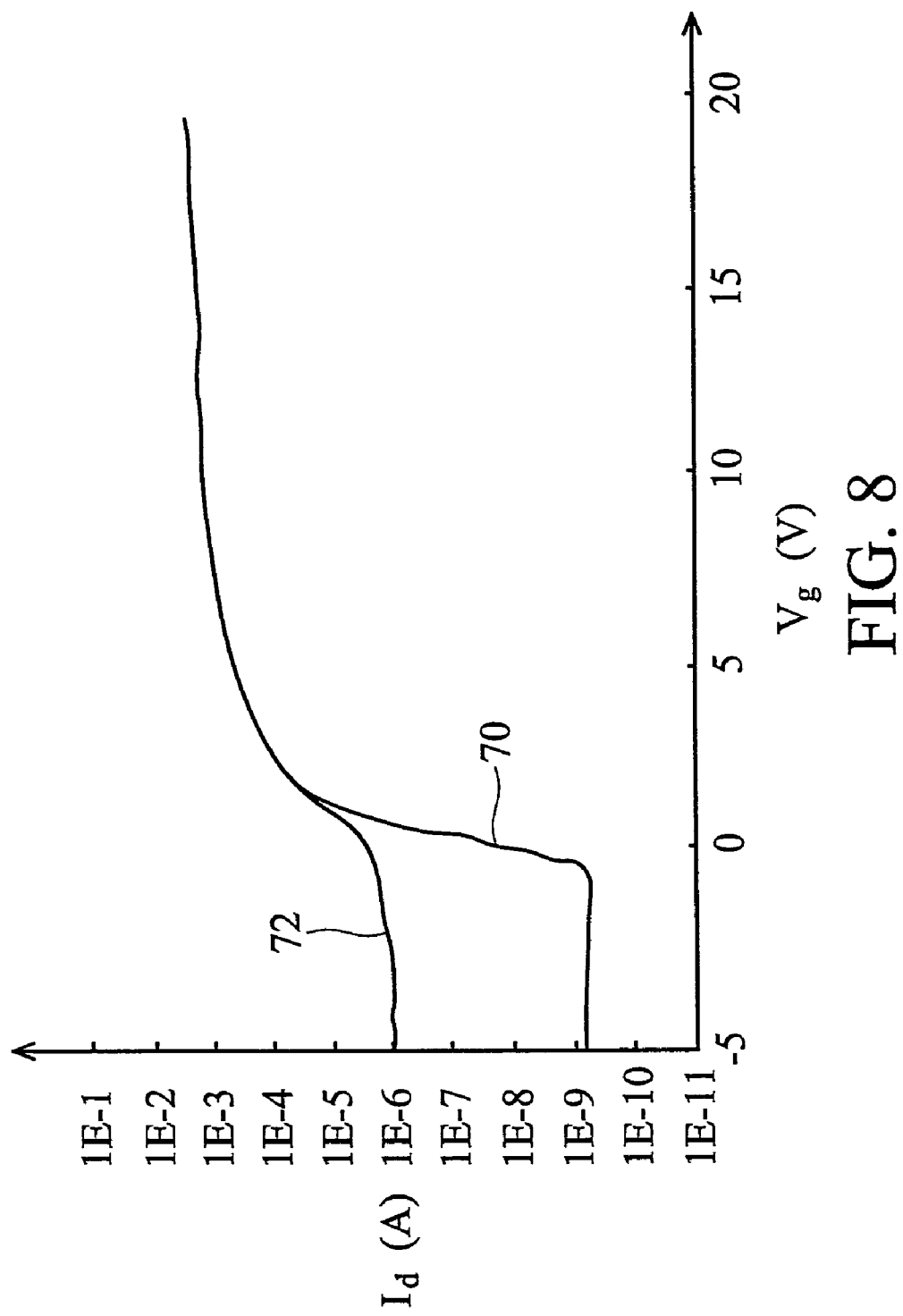
FIG. 8 illustrates leakage currents obtained from a prior art high-voltage MOS device, wherein leakage currents significantly increase after a BTS test.

By using the preferred embodiment, the leakage current caused by the BTS test is substantially eliminated. FIG. 8 illustrates experimental results obtained from HVMOS devices having no shielding patterns. Line 70 illustrates the leakage current before a BTS test, and line 72 illustrates the leakage current after a BTS test. It is found that the leakage current 72 has a three-order increase over line 70. As a comparison, FIG. 9 illustrates experimental results obtained from HVMOS devices having shielding patterns. Note that line 80, which illustrates the leakage current before the BTS test, and line 82, which illustrates the leakage current after the BTS test, substantially overlap.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   a first high-voltage well (HVW) region of a first conductivity type overlying the substrate;
   a second HVW region of the first conductivity type overlying the substrate;
   a third HVW region overlying the substrate, wherein the third HVW region is of a second conductivity type opposite the first conductivity type, and wherein the third HVW region has at least a portion between the first HVW region and the second HVW region;
   an insulation region in the first HVW region, the second HVW region, and the third HVW region;
   a gate dielectric over and extending from the first HVW region to the second HVW region;
   a gate electrode on the gate dielectric;
   a shielding pattern over the insulation region, wherein the gate electrode and the shielding pattern have a spacing of less than about 0.4 µm;
   a source region and a drain region adjacent the gate electrode;
   a source contact plug over, and electrically connected to, the source region; and
   a drain contact plus over, and electrically connected to, the drain region, wherein the shielding pattern is electrically disconnected from the gate electrode, the source region, and the drain region.

2. The semiconductor structure of claim 1, wherein the spacing is less than about 0.25 µm.

3. The semiconductor structure of claim 1, wherein the spacing is equal to a minimum spacing defined by design rules used for designing the semiconductor structure.

4. The semiconductor structure of claim 1, wherein the shielding pattern is connected to a voltage substantially lower than a stress voltage applied to the gate electrode.

5. The semiconductor structure of claim 1, wherein the shielding pattern is connected to the substrate.

6. The semiconductor structure of claim 1, wherein a ratio of a length of the shielding pattern to a length of the gate electrode is greater than about 0.2.

7. The semiconductor structure of claim 1 further comprising:
   an additional insulation region in the first HVW region, the second HVW region, and the third HVW region, the additional insulation region being on an opposite side of the gate dielectric from the insulation region; and
   an additional shielding pattern over the additional insulation region, wherein the additional shielding pattern is electrically insulated from the gate electrode, and wherein the gate electrode and the additional shielding pattern have a spacing of less than about 0.4 µm.

8. The semiconductor structure of claim 1, wherein the gate electrode and the shielding pattern are formed of a same material.

9. The semiconductor structure of claim 1, wherein the first conductivity type is n-type and the second conductivity type is p-type.

10. A semiconductor structure comprising:
    a substrate;
    a first high-voltage N-well (HVNW) region overlying the substrate;
    a second HVNW region overlying the substrate;
    a high-voltage P-well (HVPW) region overlying the substrate, the HVPW region having at least a portion between the first HVNW region and the second HVNW region;
    an insulation region in the first HVNW region, the second HVNW region, and the HVPW region;
    a gate dielectric over and extending from the first HVNW region to the second HVNW region;
    a gate electrode on the gate dielectric;
    a source region and a drain region adjacent the gate electrode;
    a source contact plug over, and electrically connected to, the source region;
    a drain contact plug over, and electrically connected to, the drain region;
    a shielding pattern over the insulation region, wherein the shielding pattern is electrically insulated from the gate electrode;
    a first voltage source connected to the shielding pattern, wherein the shielding pattern is grounded; and
    a second voltage source having a stress voltage connected to the gate electrode.

11. The semiconductor structure of claim 10, wherein the source region and the drain region are aligned to a first horizontal direction, and wherein the shielding pattern and the gate electrode are aligned to a second horizontal direction perpendicular to the first horizontal direction.

12. The semiconductor structure of claim 10, wherein the shielding pattern is electrically insulated from the source region and the drain region.

13. A semiconductor structure comprising:
    a substrate;
    a first high-voltage N-well (HVNW) region and a second HVNW region in the substrate, the first and the second HVNW regions being along a first direction;
    a high-voltage P-well (HVPW) region in the substrate, the HVPW region having at least a portion between the first HVNW region and the second HVNW region;
    a gate dielectric over and extending from the first HVNW region to the second HVNW region;
    a gate electrode on the gate dielectric;
    an insulation region in the first HVNW region, the second HVNW region and the HVPW region, wherein the insulation region comprises a portion extending from an edge of the gate dielectric in a second direction perpendicular to the first direction;
    a shielding pattern having a substantial portion directly over the insulation region, wherein the shielding pattern is electrically insulated from the gate electrode, and wherein the gate electrode and the shielding pattern have a spacing of less than about 0.4 μm;
a source region and a drain region adjacent the gate electrode;
a source contact plug over, and electrically connected to, the source region; and
a drain contact plug over, and electrically connected to, the drain region, wherein the shielding pattern is electrically disconnected from the source region and the drain region.

14. The semiconductor structure of claim 13, wherein the spacing is less than about 0.25 μm.

15. The semiconductor structure of claim 13, wherein the gate electrode and the shielding pattern are formed of a same material and have substantially a same thickness.

16. The semiconductor structure of claim 13, wherein a ratio of a length of the shielding pattern to a length of the gate electrode is greater than about 0.2.

17. The semiconductor structure of claim 13, wherein the shielding pattern and the insulation region are separated by, and adjoining, an additional dielectric layer, wherein the gate dielectric and the additional dielectric layer are formed of a same material and have substantially a same thickness.

18. The semiconductor structure of claim 13 further comprising:
an additional insulation region in the first HVNW region, the second HVNW region, and the HVPW region and on an opposite side of the gate dielectric from the insulation region; and
an additional shielding pattern over the additional insulation region, wherein the additional shielding pattern is electrically insulated from the gate electrode, and wherein the gate electrode and the additional shielding pattern have a spacing of less than about 0.4 μm.

19. The semiconductor structure of claim 13, wherein the insulation region is a shallow trench isolation region.

20. The semiconductor structure of claim 13, wherein the insulation region has a depth of less than about 0.5 μm.

* * * * *

UNITED STATES PATENT AND TRADEMARK OFFICE
CERTIFICATE OF CORRECTION

PATENT NO. : 7,521,741 B2 Page 1 of 1
APPLICATION NO. : 11/593424
DATED : April 21, 2009
INVENTOR(S) : Jong et al.

It is certified that error appears in the above-identified patent and that said Letters Patent is hereby corrected as shown below:

In Col. 7, line 47, delete "plus" and insert --plug--.

Signed and Sealed this

Twenty-sixth Day of May, 2009

JOHN DOLL
*Acting Director of the United States Patent and Trademark Office*